(12) United States Patent
Sedarat

(10) Patent No.: US 7,852,950 B2
(45) Date of Patent: *Dec. 14, 2010

(54) METHODS AND APPARATUSES FOR CANCELING CORRELATED NOISE IN A MULTI-CARRIER COMMUNICATION SYSTEM

(75) Inventor: Hossein Sedarat, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 1300 days.

This patent is subject to a terminal disclaimer.

(21) Appl. No.: 11/067,434

(22) Filed: Feb. 25, 2005

(65) Prior Publication Data

US 2006/0193390 A1 Aug. 31, 2006

(51) Int. Cl.
*H04L 27/06* (2006.01)
(52) U.S. Cl. .............. 375/260; 375/343; 375/346
(58) Field of Classification Search ........... 375/260, 375/343, 346; 455/59; 370/69.1; 714/786, 714/794, 795
See application file for complete search history.

(56) References Cited

U.S. PATENT DOCUMENTS

| | | |
|---|---|---|
| 4,024,359 A | 5/1977 | De Marco et al. |
| 4,024,360 A | 5/1977 | Biraghi et al. |
| 4,173,714 A | 11/1979 | Bloch et al. |
| 4,384,355 A | 5/1983 | Werner |
| 4,679,227 A | 7/1987 | Hughes-Hartogs |
| 4,733,389 A | 3/1988 | Puvogel |
| 4,845,466 A | 7/1989 | Hariton et al. |
| 4,882,733 A | 11/1989 | Tanner |
| 4,977,591 A | 12/1990 | Chen et al. |
| 5,285,474 A | 2/1994 | Chow et al. |
| 5,304,940 A | 4/1994 | Harasawa et al. |
| 5,483,551 A | 1/1996 | Huang et al. |
| 5,524,125 A | 6/1996 | Tsujimoto |
| 5,555,274 A | 9/1996 | Sheets |
| 5,559,890 A | 9/1996 | Obermeier et al. |

(Continued)

FOREIGN PATENT DOCUMENTS

EP 0 377 965 7/1989

(Continued)

OTHER PUBLICATIONS

Franklin, Curt, "How DSL Works," How Stuff Works, http://computer.howstuffworks.com/dsl.htm/printable, printed Nov. 16, 2004.

(Continued)

*Primary Examiner*—Shuwang Liu
*Assistant Examiner*—Helene Tayong
(74) *Attorney, Agent, or Firm*—Sterne, Kessler, Goldstein & Fox P.L.L.C.

(57) ABSTRACT

Embodiments of an apparatus, system, and method are described for a multi-carrier communication system that cancels at least some correlated noise estimated to be present in a channel in the multi-carrier communication system. Values of noise present on at least on reference channel in a multi-channel communication system may be measured. Correlated noise on a target channel using the noise measurement on the reference channel may be estimated. A residual noise on the target channel may be determined by canceling the estimated correlated noise on the target channel.

25 Claims, 7 Drawing Sheets

U.S. PATENT DOCUMENTS

| | | | |
|---|---|---|---|
| 5,596,258 A | 1/1997 | Kimura et al. | |
| 5,596,439 A | 1/1997 | Dankberg et al. | |
| 5,627,859 A | 5/1997 | Parr | |
| 5,703,904 A | 12/1997 | Langberg | |
| 5,768,473 A | 6/1998 | Eatwell et al. | |
| 5,790,550 A * | 8/1998 | Peeters et al. | 370/480 |
| 5,815,538 A | 9/1998 | Grell et al. | |
| 5,818,872 A | 10/1998 | Gupta | |
| 5,844,940 A | 12/1998 | Goodson et al. | |
| 5,852,630 A * | 12/1998 | Langberg et al. | 375/219 |
| 5,867,539 A | 2/1999 | Koslov | |
| 5,901,205 A | 5/1999 | Smith et al. | |
| 5,909,178 A | 6/1999 | Balch et al. | |
| 5,930,268 A | 7/1999 | Kurby et al. | |
| 5,952,914 A | 9/1999 | Wynn | |
| 5,974,098 A | 10/1999 | Tsuda | |
| 5,978,373 A | 11/1999 | Hoff et al. | |
| 6,006,083 A | 12/1999 | Tong et al. | |
| 6,014,376 A | 1/2000 | Abreu et al. | |
| 6,052,420 A * | 4/2000 | Yeap et al. | 375/346 |
| 6,118,769 A | 9/2000 | Pries et al. | |
| 6,147,963 A | 11/2000 | Walker et al. | |
| 6,161,209 A | 12/2000 | Moher | |
| 6,185,429 B1 | 2/2001 | Gehrke et al. | |
| 6,205,220 B1 | 3/2001 | Jacobsen et al. | |
| 6,205,410 B1 * | 3/2001 | Cai | 702/191 |
| 6,212,227 B1 | 4/2001 | Ko et al. | |
| 6,226,322 B1 | 5/2001 | Mukherjee | |
| 6,256,326 B1 | 7/2001 | Kudo | |
| 6,266,347 B1 | 7/2001 | Amrany et al. | |
| 6,266,422 B1 * | 7/2001 | Ikeda | 381/71.11 |
| 6,295,323 B1 | 9/2001 | Gabara | |
| 6,345,071 B1 | 2/2002 | Hamdi | |
| 6,351,509 B1 | 2/2002 | Vitenberg et al. | |
| 6,359,926 B1 | 3/2002 | Isaksson | |
| 6,363,109 B1 | 3/2002 | Polley et al. | |
| 6,378,234 B1 | 4/2002 | Luo | |
| 6,411,657 B1 | 6/2002 | Verbin et al. | |
| 6,433,819 B1 | 8/2002 | Li et al. | |
| 6,445,773 B1 | 9/2002 | Liang et al. | |
| 6,456,673 B1 | 9/2002 | Wiese et al. | |
| 6,459,739 B1 | 10/2002 | Vitenberg | |
| 6,466,588 B1 | 10/2002 | Michaels | |
| 6,493,395 B1 | 12/2002 | Isaksson et al. | |
| 6,498,808 B1 | 12/2002 | Tzannes | |
| 6,507,608 B1 | 1/2003 | Norrell | |
| 6,519,291 B1 | 2/2003 | Dagdeviren et al. | |
| 6,542,028 B1 | 4/2003 | Norrell et al. | |
| 6,546,025 B1 | 4/2003 | Dupuy | |
| 6,556,635 B1 | 4/2003 | Dehghan | |
| 6,597,732 B1 | 7/2003 | Dowling | |
| 6,621,346 B1 | 9/2003 | Nabicht et al. | |
| 6,631,175 B2 | 10/2003 | Harikumar et al. | |
| 6,633,545 B1 | 10/2003 | Milbrandt | |
| 6,674,795 B1 | 1/2004 | Liu et al. | |
| 6,690,666 B1 | 2/2004 | Norrell et al. | |
| 6,721,394 B1 | 4/2004 | Murphy et al. | |
| 6,731,914 B2 | 5/2004 | Creigh et al. | |
| 6,738,418 B1 | 5/2004 | Stiscia et al. | |
| 6,754,170 B1 | 6/2004 | Ward | |
| 6,763,061 B1 | 7/2004 | Strait et al. | |
| 6,775,241 B1 | 8/2004 | Levin | |
| 6,791,995 B1 | 9/2004 | Azenkot et al. | |
| 6,798,735 B1 | 9/2004 | Tzannes et al. | |
| 6,822,998 B1 | 11/2004 | Yun et al. | |
| 6,826,404 B2 | 11/2004 | Delfs et al. | |
| 6,839,429 B1 | 1/2005 | Gaikwad et al. | |
| 6,859,488 B2 | 2/2005 | Azenkot et al. | |
| 6,871,066 B1 * | 3/2005 | Khullar et al. | 455/423 |
| 6,888,497 B2 * | 5/2005 | King et al. | 342/357.12 |
| 6,898,236 B1 | 5/2005 | Sun | |
| 6,940,973 B1 | 9/2005 | Yeap et al. | |
| 6,965,636 B1 | 11/2005 | DesJardins et al. | |
| 6,999,504 B1 | 2/2006 | Amrany et al. | |
| 6,999,507 B2 | 2/2006 | Jin | |
| 7,023,910 B1 | 4/2006 | Norrell | |
| 7,031,669 B2 | 4/2006 | Vaidyanathan et al. | |
| 7,035,661 B1 | 4/2006 | Yun | |
| 7,085,315 B1 | 8/2006 | Kelton | |
| 7,085,539 B2 * | 8/2006 | Furman | 455/67.13 |
| 7,120,211 B2 * | 10/2006 | Shmulyian et al. | 375/346 |
| 7,155,007 B1 | 12/2006 | Upton | |
| 7,174,022 B1 | 2/2007 | Zhang et al. | |
| 7,177,419 B2 | 2/2007 | Sedarat et al. | |
| 7,184,467 B2 * | 2/2007 | Jacobsen et al. | 375/222 |
| 7,200,196 B2 | 4/2007 | Li et al. | |
| 7,215,727 B2 | 5/2007 | Yousef et al. | |
| 7,221,722 B2 * | 5/2007 | Thomas et al. | 375/346 |
| 7,283,509 B2 | 10/2007 | Moon et al. | |
| 7,302,379 B2 | 11/2007 | Cioffi et al. | |
| 7,315,592 B2 | 1/2008 | Tsatsanis et al. | |
| 7,315,967 B2 | 1/2008 | Azenko et al. | |
| 7,330,544 B2 | 2/2008 | D'Angelo et al. | |
| 7,356,049 B1 | 4/2008 | Rezvani | |
| 7,366,258 B2 | 4/2008 | Kolze et al. | |
| 7,369,607 B2 | 5/2008 | Sedarat | |
| 7,421,015 B2 | 9/2008 | Sedarat | |
| 7,433,395 B2 | 10/2008 | Sedarat | |
| 7,443,916 B2 | 10/2008 | Sedarat et al. | |
| 7,502,336 B2 | 3/2009 | Romano et al. | |
| 7,529,984 B2 | 5/2009 | Heise | |
| 7,555,037 B2 | 6/2009 | Sedarat | |
| 2001/0009850 A1 | 7/2001 | Kushige | |
| 2001/0011019 A1 | 8/2001 | Jokimies | |
| 2001/0055332 A1 | 12/2001 | Sadjadpour et al. | |
| 2002/0001340 A1 | 1/2002 | Shenoi et al. | |
| 2002/0044597 A1 | 4/2002 | Shively et al. | |
| 2002/0057713 A1 | 5/2002 | Bagchi et al. | |
| 2002/0078247 A1 | 6/2002 | Lu et al. | |
| 2002/0122515 A1 | 9/2002 | Bodenschatz | |
| 2002/0154620 A1 | 10/2002 | Azenkot et al. | |
| 2002/0163959 A1 | 11/2002 | Haddad | |
| 2003/0021240 A1 | 1/2003 | Moon et al. | |
| 2003/0035469 A1 | 2/2003 | Frank et al. | |
| 2003/0043925 A1 | 3/2003 | Stopler et al. | |
| 2003/0048368 A1 | 3/2003 | Bosco et al. | |
| 2003/0055996 A1 | 3/2003 | Mori et al. | |
| 2003/0091053 A1 | 5/2003 | Tzannes et al. | |
| 2003/0099285 A1 | 5/2003 | Graziano et al. | |
| 2003/0099286 A1 | 5/2003 | Graziano et al. | |
| 2003/0099350 A1 | 5/2003 | Bostoen et al. | |
| 2003/0108094 A1 | 6/2003 | Lai et al. | |
| 2003/0112860 A1 | 6/2003 | Erdogan | |
| 2003/0124983 A1 | 7/2003 | Parssinen et al. | |
| 2003/0185176 A1 | 10/2003 | Lusky et al. | |
| 2003/0206579 A1 | 11/2003 | Bryant | |
| 2003/0227967 A1 | 12/2003 | Wang et al. | |
| 2004/0057502 A1 | 3/2004 | Azenkot et al. | |
| 2004/0066865 A1 | 4/2004 | Yousef et al. | |
| 2004/0071240 A1 | 4/2004 | Betts | |
| 2004/0087278 A1 | 5/2004 | Lin et al. | |
| 2004/0091025 A1 | 5/2004 | Sindhushayana et al. | |
| 2004/0111345 A1 | 6/2004 | Chuang et al. | |
| 2004/0125015 A1 * | 7/2004 | King et al. | 342/357.06 |
| 2004/0141548 A1 | 7/2004 | Shattil | |
| 2004/0156441 A1 | 8/2004 | Peeters et al. | |
| 2004/0176063 A1 | 9/2004 | Choi | |
| 2004/0185852 A1 | 9/2004 | Son et al. | |
| 2004/0213170 A1 * | 10/2004 | Bremer | 370/282 |
| 2004/0223449 A1 | 11/2004 | Tsuie et al. | |
| 2005/0041753 A1 | 2/2005 | Cunningham | |
| 2005/0047489 A1 | 3/2005 | Yousef et al. | |
| 2005/0047514 A1 | 3/2005 | Bolinth et al. | |
| 2005/0053229 A1 * | 3/2005 | Tsatsanis et al. | 379/406.01 |

| | | | |
|---|---|---|---|
| 2005/0094550 A1 | 5/2005 | Huh et al. |
| 2005/0099967 A1 | 5/2005 | Baba |
| 2005/0111561 A1 | 5/2005 | Sedarat et al. |
| 2005/0143008 A1 | 6/2005 | Bailey |
| 2005/0159128 A1 | 7/2005 | Collins et al. |
| 2005/0169357 A1 | 8/2005 | Sedarat |
| 2005/0190825 A1 | 9/2005 | Sedarat |
| 2005/0190848 A1 | 9/2005 | Kiyanagii et al. |
| 2005/0190871 A1 | 9/2005 | Sedarat |
| 2005/0216441 A1 | 9/2005 | Thomas et al. |
| 2005/0271129 A1 | 12/2005 | Reina |
| 2005/0276355 A1 | 12/2005 | Chow et al. |
| 2006/0002457 A1 | 1/2006 | Romano et al. |
| 2006/0019687 A1 | 1/2006 | Garg et al. |
| 2006/0039550 A1 | 2/2006 | Chadha et al. |
| 2006/0062379 A1 | 3/2006 | Sedarat et al. |
| 2006/0067388 A1 | 3/2006 | Sedarat et al. |
| 2006/0078044 A1 | 4/2006 | Norrell et al. |
| 2006/0083321 A1 | 4/2006 | Sedarat |
| 2006/0083322 A1 | 4/2006 | DesJardins et al. |
| 2006/0083323 A1 | 4/2006 | DesJardins et al. |
| 2006/0083324 A1 | 4/2006 | DesJardins et al. |
| 2006/0115030 A1 | 6/2006 | Erving et al. |
| 2006/0126747 A1 | 6/2006 | Wiese |
| 2006/0171480 A1 | 8/2006 | Erving et al. |
| 2006/0203843 A1 | 9/2006 | Liu |
| 2006/0222098 A1 | 10/2006 | Sedarat et al. |
| 2006/0227913 A1 | 10/2006 | Sedarat |
| 2006/0253515 A1 | 11/2006 | Sedarat |
| 2006/0291537 A1 | 12/2006 | Fullerton et al. |
| 2007/0002940 A1 | 1/2007 | Zhou |
| 2007/0183526 A1 | 8/2007 | Norrell et al. |
| 2007/0217492 A1 | 9/2007 | Cox et al. |

FOREIGN PATENT DOCUMENTS

| | | |
|---|---|---|
| EP | 0 844 758 A2 | 5/1998 |
| EP | 0 966 134 A2 | 12/1999 |
| EP | 1 389 846 A2 | 2/2004 |
| EP | 1 388 944 A1 | 4/2004 |
| WO | WO 2006/042274 A1 | 4/2006 |

OTHER PUBLICATIONS

Sedarat, Hossein, et al., "Impulse Noise Protection for Multi-Carrier Communication Systems", Submitted to IEEE ICASSP (2005).
Sedarat, Hossein, et al., "Multicarrier Bit-Loading in Presence of Biased Gaussian Noise Sources", IEEE Consumer Communication and Networking Conference, Jan. 2005.
Baccarelli, Enzo, et al., Novel Efficient Bit-Loading Algorithms for Peak-Energy-Limited ADSL-Type Multicarrier Systems, IEEE Trans on Signal Processing, vol. 50, No. 5, May 2002.
Sonalkar, Ranjan, et al., "An Efficient Bit-Loading Algorithm for DMT Application," IEEE Comm. Letters, vol. 4, pp. 80-82, Mar. 2000.
Campello, Jorge, "Optimal Discrete Bit Loading for Multicarrier Modulation Systems," IEEE International Symposium on Information Theory, Aug. 1998, Cambridge, MA.
Chow, Peter S., et al., "A Practical Discrete Multitone Transceiver Loading Algorithm for Data Transmission over Spectrally Shaped Channels," IEEE Trans. on Communications, vol. 43, No. 2, 1995.
Fischer, Robert F.H., et al., "A New Loading Algorithm for Discrete Multitone Transmission," IEEE, 1996, pp. 724-728.
Lampe, Lutz H.-J., et al., "Performance Evaluation of Non-Coherent Transmission over Power Lines," 8 pgs.
Henkel, Werner, et al., "Maximizing the Channel Capacity of Multicarrier Transmission by Suitable Adaptation of the Time-Domain Equalizer," IEEE, vol. 48, No. 12, Dec. 2000.
Lashkarian, Navid, et al., "Fast Algorithm for Finite-Length MMSE Equalizers with Application to Discrete Multitone Systems," IEEE 1999, pp. 2753-2756.
Melsa, Peter J.W., et al., "Impulse Response Shortening for Discrete Multitone Transceivers," IEEE vol. 44, No. 12, Dec. 1996, pp. 1662-1672.
Al-Dhahir, Naofal, et al., "Optimum Finite-Length Equalization for Multicarrier Transceivers," IEEE vol. 44, No. 1, Jan. 1996, pp. 56-64.
Leke, Achankeng, et al., "A Maximum Rate Loading Algorithm for Discrete Multitone Modulation Systems," IEEE 1997, pp. 1514-1518.
Bingham, John A.C., "Multicarrier Modulation for Data Transmission: An Idea Whose Time Has Come," IEEE, May 1990, pp. 5-14.
Arslan, G., et al., "Equalization for Discrete Multitone Transceivers to Maximize Bit Rate," IEEE, vol. 49, No. 12, Dec. 2001, pp. 3123-3135.
Farhang-Boroujeny, Behrouz, et al., "Design Methods for Time-Domain Equalizers in DMT Transceivers," IEEE, vol. 49, No. 3, Mar. 2001, pp. 554-562.
Wyglinski, Alexander M., et al., "An Efficient Bit Allocation for Multicarrier Modulation," IEEE Wireless Communication, Networking Conference, Atlanta, GA, Mar. 2004, 4 pgs.
"Draft Standard," Network and Customer Installation Interfaces—Asymmetric Digital Subscriber Line (ADSL) Metallic Interface, Draft American National Standard for Telecommunications, Alliance for Telecommunications Industry Solutions, T1.413-1998.
Krongold, Brian S., et al., "Computationally Efficient Optimal Power Allocation Algorithms for Multicarrier Communication Systems," IEEE Trans. on Communications, vol. 48, pp. 23-27, Jan. 2000.
Barreto, Andre Noll, et al., "Adaptive Bit Loading for Wireless OFDM Systems," IEEE International Symposium on Personal, Indoor and Mobile Radio Communications, Oct. 2001.
Armada, Ana Garcia, et al., "Multiuser Constant-Energy Bit Loading for MPSK-Modulated Orthogonal Frequency Division Multiplexing" IEEE Wireless Communications and Networking Conference (WCNC), Mar. 2002.
Ahmed, Nadeem, et al., "Optimal Transmit Spectra for Communication in the Presence of Crosstalk and Imperfect Echo Cancellation," IEEE, p. 17-21, © 2001.
Blahut, Richard E., "Theory and Practice of Error Control Codes," Chapter 7: Bosc-Chaudhuri-Hocquenghem Codes, 1984.
Blahut, Richard E., "Theory and Practice of Error Control Codes," Chapter 11: Fast Algorithms, 1984.
Cioffi, J. et al., "Analog RF Cancelation with SDMT (96-084)," T1E1.4/96-084 contribution, Amati Communications Corporation, Apr. 22, 1996.
Cioffi, J.M. et al., "Generalized Decision-Feedback Equalization for Packet Transmission with ISI and Gaussian Noise," In Communications, Computation, Control, and Signal Processing, a tribute to Thomas Kailath, Kluwer Academic Publishers, p. 79-127, 1997.
Communication pursuant to Article 94(3), EPC, 05806662.2-1525, Ref. W3477002EPPWOSv, dated Feb. 26, 2008.
Communication pursuant to Rules 109 and 110 EPC, 05806662.2-1525, PCT/US2005/036655, W3477002EPPWOSv, 2 pages, dated May 21, 2007.
International Preliminary Report on Patentability, PCT/US2005/023634 filed Jun. 30, 2005, mailed Jan. 18, 2007.
International Preliminary Report on Patentability (Chapter 1), International Application No. PCT/US2005/036655, filed Oct. 11, 2005, mailed Apr. 11, 2007.
International Preliminary Report on Patentability, International Application No. PCT/US2007/001997, filed Jan. 25, 2007, mailed Aug. 21, 2008.
International Telecommunication Union (ITU) Recommendation G.992.1, "Asymmetric digital subscriber line (ADSL) transceivers," Series G: Transmission Systems and Media, Digital Systems and Networks, Jun. 1999.
International Telecommunication Union (ITU) Recommendation G.992.3, "Asymmetric digital subscriber line transceivers -2 (ASDL 2), Series G: Transmission Systems and Media, Digital Systems and Networks," Jul. 2002.
International Telecommunication Union (ITU) Recommendation G.993.1, "Very high speed digital subscriber line (VDSL)," Series G: Transmission Systems and Media, Digital Systems and Networks, Jun. 2004.
International Telecommunication Union (ITU) Recommendation G.992.2, "Splitterless asymmetric digital subscriber line (ADSL)

transceivers," Series G: Transmission Systems and Media, Digital Systems and Networks, Jun. 1999.

Kamkar-Parsi et al., Wideband Crosstalk Interface Cancelling on xDSL Using Adaptive Signal Processing and Common Mode Signal, IEEE, p. IV-1045-IV-1048, 2004.

Karp et al., Zero-forcing frequency domain equalization for DMT systems with insufficient guard interval, IEEE ICASSP, p. 221-224, 2003.

Magesacher, Thomas et al., "Adaptive Interference Cancellation Using Common-Mode Information in DSL," Proceedings of European Signal Processing Conference 2005, Sep. 2005.

Magesacher, Thomas et al., "Analysis of Adaptive Interference Cancellation Using Common-Mode Information in Wireline Communications," EURSASIO Journal on Advances in Signal Processing, vol. 2007, Article 84956, Jun. 2007.

Magesacher, Thomas et al., "Information Rate Bounds in Common-Mode Aided Wireline Communications," European Transactions on Telecommunications, vol. 17, No. 5, p. 533-545, Oct. 2006.

Milosevic et al., "Simultaneous Multichannel Time Domain Equalizer Design Based on the Maximum Composite Shortening SNR," Dept. of Electrical and Compter Eng., The University of Texas, Austin, Texas, 5 pages, 2002.

Misao, Fukuda et all, "A Line Terminating LSI Using Echo Cancelling Method for ISDN Subscriber Loop Transmission," IEEE Journal on Selected Areas in Communications, vol. 6, No. 3, p. 476-483, Apr. 1988.

Okamura, Yasuka et al., "ADSL System for Time Periodic Noise Environments," XP-00086790, NEC Res. & Develop., vol. 40, No. 1, p. 64-69, Jan. 1999.

PCT Search Report and Written Opinion of the International Searching Authority, International Application No. PCT/US05/23634, International filing date Jun. 30, 2005, mailed May 4, 2006.

PCT Search Report and Written Opinion of the International Searching Authority, International Application No. PCT/US2005/036655, International filing date Oct. 11, 2005, mailed Feb. 14, 2006.

PCT Search Report and Written Opinion of the International Searching Authority, International Application No. PCT/US2007/001997, International filing date Jan. 25, 2007, mailed Jul. 18, 2007.

PCT Search Report and Written Opinion of the International Searching Authority, International Application No. PCT/US06/09687, International Filing Date Mar. 16, 2006, Mailed Nov. 16, 2007.

PCT Search Report and Written Opinion of the International Searching Authority, International Application No. PCT/US06/10004, International Filing Date Mar. 16, 2006, Mailed Oct. 10, 2007.

PCT Search Report and Written Opinion of the International Searching Authority, International Application No. PCT/US06/09804, Filing Date Mar. 17, 2006, Mailed Apr. 2, 2008.

PCT Search Report and Written Opinion of the International Searching, International Application No. PCT/US09/58821, Filing Date Sep. 29, 2009, Mailed Dec. 2, 2009.

Perez-Alvarez, Ivan A., et al., "A Differential Error Reference Adaptive Echo Canceller for Multilevel PAM Line Codes," Work supported by National Project T1C95-0026, IEEE, p. 1707-1710, © 1996.

Sonalkar, Ranjan, et al., "Shannon Capacity of Frequency-Overlapped Digital Subscriber Loop Channels," IEEE, p. 1741-1745, © 2002.

Starr, Thomas et al., "Understanding Digital Subscriber Line Technology," p. 94-97, 147-154, 206-217, 241-251, and 330-331, Prentice Hall PTR, Upper Saddle River, NJ, 1999.

STLC60134S: TOSCA Integrated ADSL. CMOS Analog Front-End Circuit, Aug. 1999.

Toumpakaris, D. "A byte-erasure method for improved impulse immunity in DSL systems using soft information from an inner code," IEEE International Conference on Communications (ICC), vol. 4, p. 2431-2435, May 2003.

Toumpakaris, D., "A Square Distance-Based Byte-Erasure Method for Reduced-delay Protection of DSL Systems from Non-stationary Interference," IEEE International Conference on Communications (ICC), vol. 4, p. 2114-2119, San Francisco, CA, Dec. 2003.

Toumpakaris, D., "Reduced Delay Protection of DSL Systems Against Nonstationary Disturbances," IEEE Trans. Communications, vol. 52, No. 11, Nov. 2004.

Wu, Cheng-Shing, et al., "A Novel Cost-Effective Multi-Path Adaptive Interpolated FIR (IFIR)-Based Echo Canceller," IEEE, p. V-453-V-456, © 2000.

Zogakis, T.N., et al., "Impulse Noise Mitigation Strategies for Multicarrier Modulation," Proceedings of the International Conference on Communications (ICC), vol. 3, p. 784-788, May 23, 1993.

Non-Final Office Action dated May 16, 2008, U.S. Appl. No. 11/131,392, filed May 16, 2005, Wiese.

Non-Final Office Action dated Dec. 10, 2008, U.S. Appl. No. 11/131,392, filed May 16, 2005, Wiese.

Non-Final Office Action dated Jun. 9, 2009, U.S. Appl. No. 11/131,392, filed May 16, 2005, Wiese.

Non-Final Office Action dated Aug. 21, 2008, U.S. Appl. No. 11/248,704, filed Oct. 11, 2005, Norrell et al.

Non-Final Office Action dated Feb. 4, 2009, U.S. Appl. No. 11/248,704, filed Oct. 11, 2005, Norrell et al.

Final Office Action dated Aug. 5, 2009, U.S. Appl. No. 11/248,704, filed Oct. 11, 2005, Norrell et al.

Non-Final Office Action dated Nov. 26, 2008, U.S. Appl. No. 11/348,733, filed Feb. 6, 2006, Norrell et al.

Non-Final Office Action dated Apr. 8, 2009, U.S. Appl. No. 11/348,733, filed Feb. 6, 2006, Norrell et al.

Non-Final Office Action dated Oct. 23, 2009, U.S. Appl. No. 11/348,733, filed Feb. 6, 2006, Norrell et al.

Non-Final Office Action dated Feb. 24, 2009, U.S. Appl. No. 11/377,114, filed Mar. 15, 2006, Sedarat.

Final Office Action dated Jul. 31, 2009, U.S. Appl. No. 11/377,114, filed Mar. 15, 2006, Sedarat.

Non-Final Office Action dated Nov. 9, 2007, U.S. Appl. No. 11/377,083, filed Mar. 15, 2006, Sedarat.

Non-Final Office Action dated May 19, 2008, U.S. Appl. No. 11/377,083, filed Mar. 15, 2006, Sedarat.

Notice of Allowance dated May 18, 2009, U.S. Appl. No. 11/377,083, filed Mar. 15, 2006, Sedarat.

Final Office Action dated Dec. 4, 2008, U.S. Appl. No. 11/377,083, filed Mar. 15, 2006, Sedarat.

Non-Final Office Action dated Dec. 11, 2008, U.S. Appl. No. 11/377,084, filed Mar. 15, 2006, Sedarat et al.

Non-Final Office Action dated Aug. 4, 2009, U.S. Appl. No. 11/377,084, filed Mar. 15, 2006, Sedarat et al.

* cited by examiner

METHODS AND APPARATUSES FOR CANCELING CORRELATED NOISE IN A MULTI-CARRIER COMMUNICATION SYSTEM

TECHNICAL FIELD

Embodiments of the present invention pertain to the field of communication systems and, more particularly, to multi-carrier communication systems.

BACKGROUND

A multi-carrier communication system, such as a Discrete Multiple-Tone (DMT) system in the various types of Digital Subscriber Line (e.g. ADSL and VDSL) systems, carries information from a transmitter to a receiver over a number of tones. Each tone may be a group of one or more frequencies defined by a center frequency and a set bandwidth. The tones are also commonly referred to as sub-carriers or sub-channels. Each tone acts as a separate communication channel to carry information between a local transmitter-receiver device and a remote transmitter-receiver device.

DMT communication systems use a modulation method in which the available bandwidth of a communication channel, such as twisted-pair copper media, is divided into these numerous tones. A communication channel may also be known as a communication channel. The term communication channel is understood to refer generally to a physical transmission medium, including copper, optical fiber, and so forth, as well as other transmission mediums, including radio frequency (RF) and other physical or non-physical communication signal paths.

There are various types of interference and noise sources in a multi-carrier communication system. Interference and noise may corrupt the data-bearing signal on a tone as the signal travels through the communication channel and is decoded at the receiver. The transmitted data-bearing signal may further be decoded erroneously by the receiver because of this signal corruption.

A measure of the quality of signal carried by a tone is its Signal to Noise Ratio (SNR). SNR is the ratio of the received signal strength (power) over the noise strength in the frequency range of operation. High SNR results in high signal quality being carried by a tone. Another measure of signal quality is bit error rate (BER) for a given tone. BER is inversely related to SNR. Thus, when the SNR of a tone is low, BER of the tone is high.

The number of data bits or the amount of information that a tone carries may vary from tone to tone and depends on the relative power of the data-bearing signal compared to the power of the corrupting signal on that particular tone. In order to account for potential interference on the transmission line and to guarantee a reliable communication between the transmitter and receiver, each tone is designed to carry a limited number of data bits per unit time based on the tone's SNR using a bit-loading algorithm. The number of bits that a specific tone may carry decreases as the relative strength of the corrupting signal increases, that is when the SNR is low or the BER is high. Thus, the SNR of a tone may be used to determine how much data should be transmitted by the tone.

It is often assumed that the corrupting signal is an additive random source with Gaussian distribution and white spectrum. However, this assumption may not be true in many practical cases. Inter-symbol interference (ISI), uncancelled residual echo, radio-frequency interference (RFI), windowed background noise and phase error are some such noise sources that may not have a white, Gaussian distribution. Bit-loading algorithms, which are methods to determine the number of data bits per tone, are usually designed based on the assumption of additive, white, Gaussian noise. With such algorithms, the effects of noise sources that do not have a white, Gaussian distribution maybe overestimated (or underestimated), resulting in the Bit-loading algorithm allocating lower (or higher) data bits per tone than the tone can actually carry.

SUMMARY

Embodiments of an apparatus, system, and method are described for a multi-carrier communication system that cancels at least some correlated noise estimated to be present on a channel in the multi-carrier communication system. Values of noise present on at least on reference channel in a multi-carrier communication system may be measured. Noise on a second channel correlated to the noise on the reference channel may be estimated using the noise measured on the reference channel. A residual noise on the second channel may be determined by canceling the estimated correlated noise on the second channel.

Other features and adventures of the present invention will be apparent from the accompanying drawings and the detailed description that follows.

BRIEF DESCRIPTION OF THE DRAWINGS

Embodiments of the present invention are illustrated by way of example and are not intended to be limited by the figures of the accompanying drawings, in which.

DETAILED DESCRIPTION

In the following detailed description, numerous specific details are set forth in order to provide a thorough understanding of the invention. However, it will be understood by those skilled in the art that certain embodiments of the present invention may be practiced without these specific details. In other instances, well-known methods, procedures, components, and circuits have not been described in detail so as not to obscure the presented embodiments of the invention. The following detailed description includes several modules, which will be described below. These modules may be implemented by hardware components, such as logic, or may be embodied in machine-executable instructions, which may be used to cause a general-purpose or special-purpose processor programmed with the instructions to perform the operations described herein. Alternatively, the operations may be performed by a combination of hardware and software.

Inter-symbol interference (ISI), impulse noise, uncancelled residual echo, radio-frequency interference (RFI), windowed background noise and phase error are some noise sources that may not have a white, Gaussian distribution. Some of these noise sources are correlated by nature. Accordingly, the presence of one of these noise sources on a tone may have an affect on the noise on one or more neighboring tones. Thus, noise on one tone may be affected by or correlated to the noise on a neighboring tone. ISI and impulse noise are examples of noise sources that are correlated by nature. Thus, the component of ISI on one tone may be related to that of other tones. Similarly, impulse noise on one tone may affect the noise on one or more neighboring tones.

Other noise sources, such as, windowed background noise, RFI and uncancelled echo, are not correlated by nature. Accordingly, the presence of one of these noise sources on one tone may not affect or contribute to the noise on one or more neighboring tones. However, due to some operations at the receiver end in the DMT communication system, these noise sources on one or more tones may also affect noise on other neighboring tones.

Figure 1:
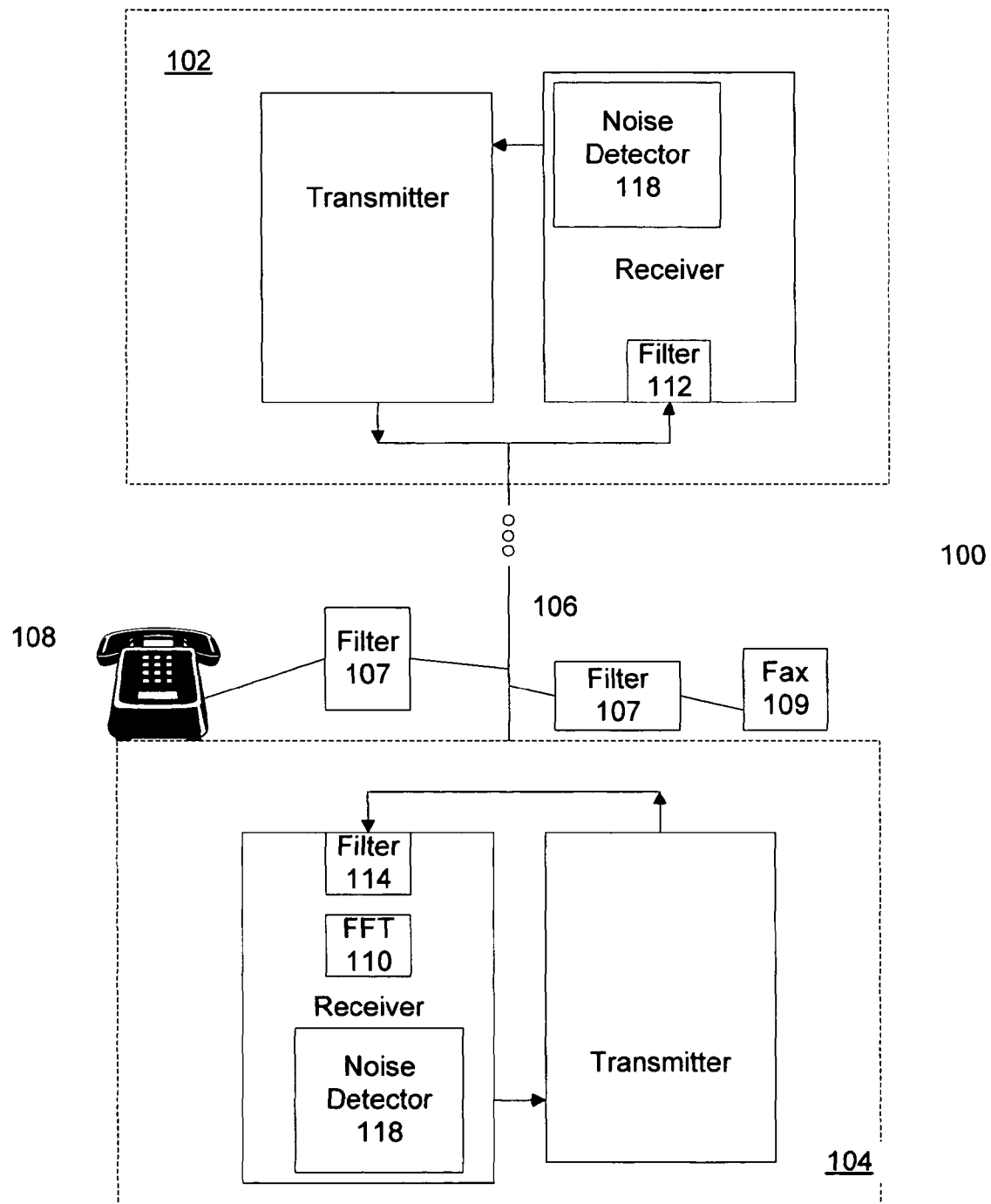
FIG. 1 illustrates a block diagram of an embodiment of a discrete multiple tone communication system.

FIG. 1 illustrates an embodiment of a DMT communication system. The discrete multiple tone (DMT) system 100, such as a Digital Subscriber Line (DSL) based network, may have a central office, multiple distribution points, and multiple end users. The central office may contain the first transmitter-receiver device 102, such as a modem, that communicates with the second transmitter-receiver device 104 at an end user's location, such as a set top box. The DMT communication system carries information from a transmitter portion of the first transmitter-receiver device 102 through a communication channel 106, such as a telephone line, to a receiver portion of the second transmitter-receiver device 104 with a number of sub-carriers or tones. Other Plain Old Telephone Service (POTS) devices, such as telephones 108, facsimile machines 109, may also be coupled to transmission medium 106. An isolating filter 107 generally exists between the telephone and the transmission medium 106 to filter out non-POTS band signals and provide proper impedance matching. A training period occurs when initially establishing communications between the first transmitter-receiver device 102 and the second transmitter-receiver device 104.

Each transmitter portion of the transmitter-receiver device 102, 104 may transmit data over a number of mutually independent sub-carriers or tones. In an Asymmetric Digital Subscriber Line (ADSL) system, each tone may be modulated using a Quadrature Amplitude Modulation (QAM) scheme. The transmitter portion of the first transmitter-receiver device 102 may transmit frames within the multi-carrier signal that each carry 512 time samples of data to the receiver portion of the second transmitter-receiver device 104 using the QAM scheme. The transmitter portion of the first transmitter-receiver device 102 may separate successive frames of 512 samples of data with a guard period of 32 samples of non-data.

The number of information bits loaded on each tone and the size of corresponding QAM constellation may potentially vary from one tone to another and depends generally on the tone's SNR. When the characteristics of signal and noise are known for all tones, a bit-loading algorithm can determine the optimal distribution of data bits and signal power amongst sub-carriers. Thus, the transmitter portion of the transmitter-receiver device 102, 104 modulates each sub-carrier with a data point in a QAM constellation.

The second transmitter-receiver device 104 may include a block of filters 114 to filter the DMT signal. For instance, the DMT signal may pass through a transmit filter, which receives an input transmit signal from a transmit path and generates a filtered transmit signal. The filtered transmit signal may pass through an Echo cancellation filter (ECF), which receives an input from the output of the transmit filter and generates a copy of an echo signal by a linear filtering operation. Further, the signal may pass through a receive filter. The receive filter performs linear filtering operation and attempts to suppress out of band noise. The signal may also pass a Time domain Equalization (TEQ) filter, which applies linear filtering to received data samples to shorten the effective channel spread.

Figure 2:
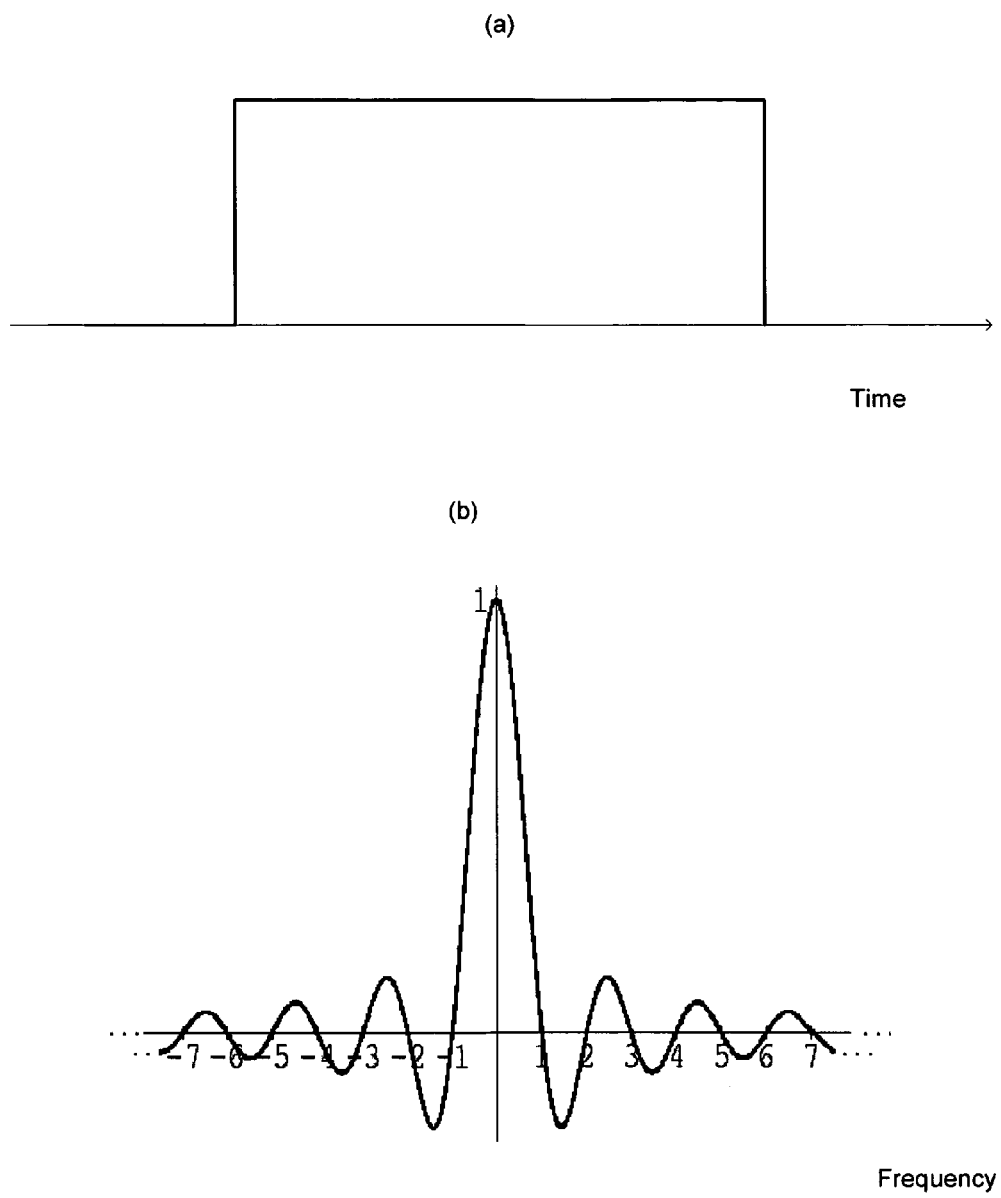
FIG. 2a illustrates an embodiment of a window with a rectangular shape in time domain.
FIG. 2b illustrates an embodiment of a sinc function.

The filtered signal is then decomposed into sub-carrier data. A second transmitter-receiver device 104 typically uses a Fast Fourier Transform (FFT) block 110 to derive sub-carrier data from the received samples in time domain. The FFT Block 110 acts as a demodulator to separate data corresponding to each tone in the multiple tone signal. The FFT operation 110 involves a step of windowing of the received samples of data in time domain. FFT over a finite window of signal results in convolution in frequency domain of signal spectrum with the Fourier transform of the window. Accordingly, if the window has a rectangular shape, the convolution kernel in the frequency domain is the sinc function. FIG. 2a illustrates a window with a rectangular shape in time domain. FIG. 2b illustrates the corresponding sinc function, with which the signal gets convolved in frequency domain.

For the multi-tone signal, windowing does not generate a correlation between signals on sub-carriers or tones. Accordingly, a signal over one or more tones does not affect the signal over another tone. The reason that the windowing operation does not affect the DMT signal is because the multi-tone signal is designed to have a cyclic prefix. The cyclic prefix or extension allows the DMT signal to be windowed without causing the signal in one tone to affect the signal on another tone.

Figure 3:
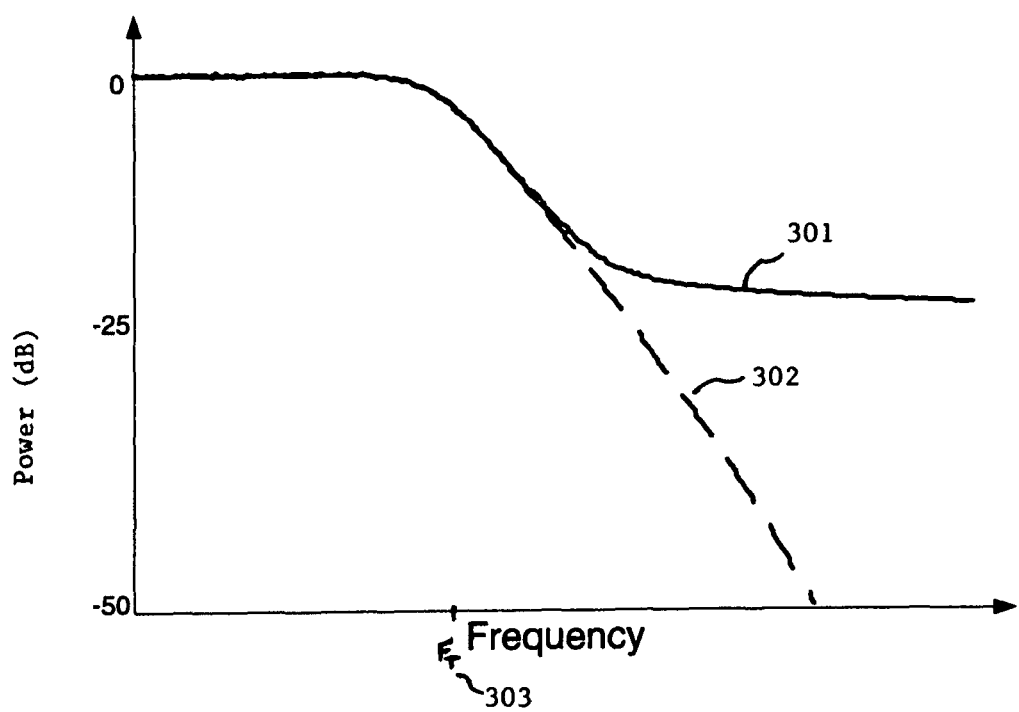
FIG. 3 illustrates an embodiment of the power spectral density of a noise source.

However, for any noise source without a cyclic extension, such as background noise, uncancelled echo, ISI and phase error, the FFT operation 110 results in spectral bleeding from one frequency to another, causing higher noise signal levels at some frequencies. FIG. 3 illustrates the effect of convolution in the frequency domain on a noise source without a cyclic extension. The solid line 301 shows the power spectral density of the signal before windowing. $F_T$ 303 represents the transition frequency where the power spectral density of the noise source changes sharply from high to low. The dashed line 302 illustrates the power spectral density of the signal after the FFT operation. FIG. 3 illustrates that the spectral bleeding from lower frequencies to higher frequencies due to the windowing operation conducted by FFT block 110 results in a boost in noise power in frequencies to the right of the transition frequency $F_T$ 303 in which noise power was originally low.

Spectral bleeding from low frequencies to high frequencies causes error in a multi-tone system and may reduce the SNR of a channel. Additionally, the correlation of noise can also affect the decoding capabilities on decoders often used in DMT systems such as convolution and trellis decoders. Moreover, spectral bleeding from one sub-carrier or tone into neighboring sub-carriers can result in noise on a first sub-carrier affecting or contributing to the noise on neighboring sub-carriers or tones. Thus, spectral bleeding due to the windowing operation in the receiver portion of the DMT communication system results in noise on a tone correlated to the noise on another tone. This correlation of noise due to spectral bleeding can detrimentally affect the SNR of the neighboring tones.

Figure 4:
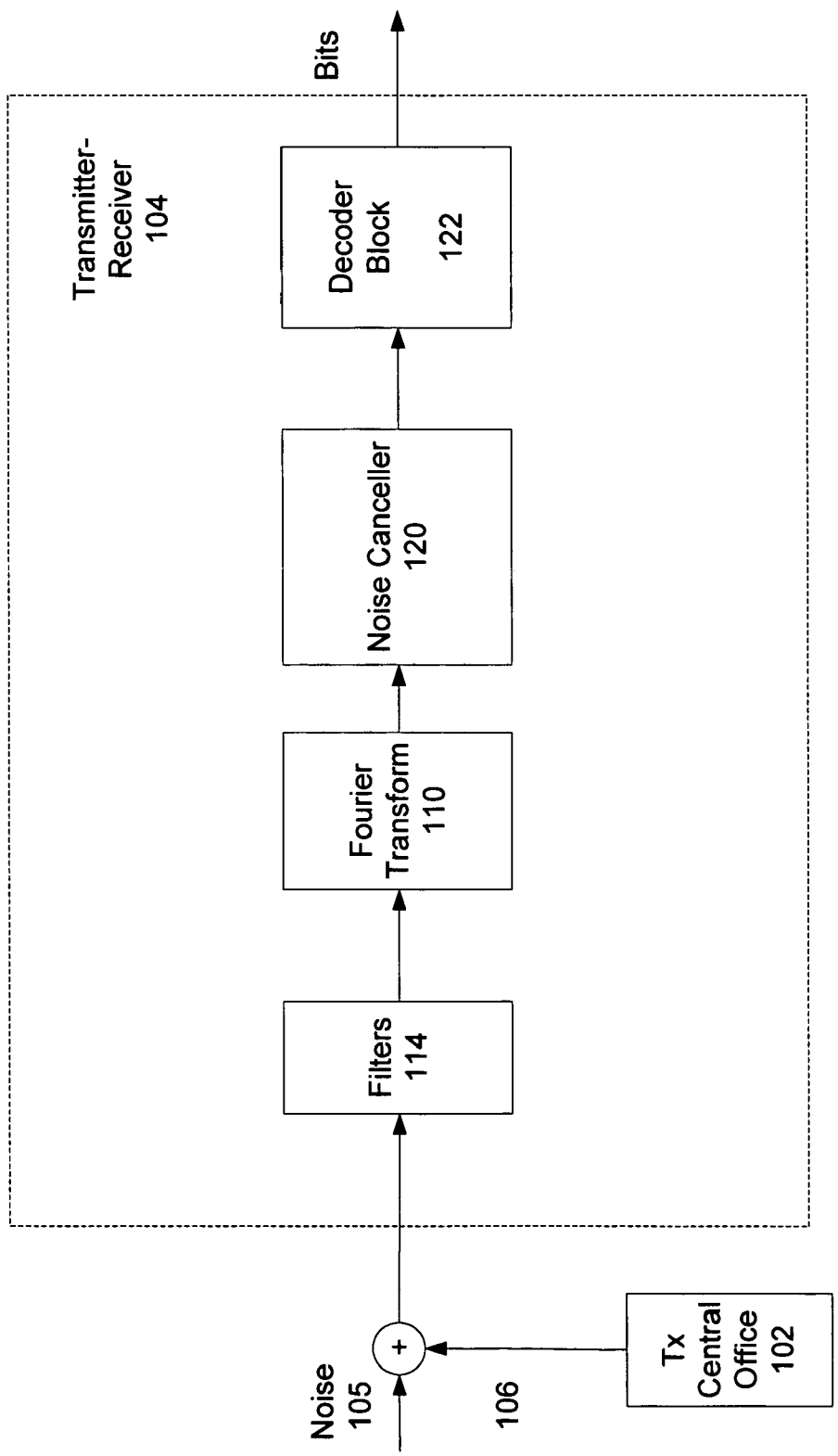
FIG. 4 illustrates an embodiment of a transmitter-receiver that cancels estimated correlated noise present in the discrete multiple tone system in accordance with the invention.

FIG. 4 illustrates a block diagram of the second transmitter-receiver 104 that cancels the component of noise present on a sub-channel estimated to be correlated to noise on one or more other sub-channels in the DMT system. As the multicarrier signal travels to the second transmitter-receiver 104 through the transmission channel 106, the signal is potentially corrupted by various noise sources 105 including inter-symbol interference (ISI), RFI, echo, phase error and so on. The signal passes through a block of filters 114 to filter the DMT signal. The filtered signal passes through the FFT Block 110 to decompose the sub-carrier data. The FFT operation 110 results in noise on a tone correlated to the noise on one or more other tones.

In one embodiment of the transmitter-receiver 104 that cancels correlated noise, the resultant signal from the FFT Block 110 is sent to a Noise Canceller 120. The Noise Canceller 120 cancels that component of noise present on a sub-channel, the target sub-channel, which is estimated to be correlated to the noise on one or more other sub-channels referred to as the reference channels. In one embodiment, the Noise Canceller 120 measures the value of noise present on at least one reference sub-channel in a DMT system. The Noise Canceller 120 may further estimate the noise on the selected target channel correlated to the noise on the reference sub-channel, using the noise measurement on the reference sub-channel. The Noise Canceller 120 may determine a residual noise on the target channel by canceling the estimated correlated noise on the target channel.

The residual signal on the target channel may be used to determine the resultant SNR on the target channel. Bit-loading algorithms may further use the SNR on the target channel to determine how much data the target channel should carry. The resultant signal from the Noise Canceller 120 may be sent to the data decoder module 122 in order to decode the data samples transmitted by the transmitter.

Figure 5:
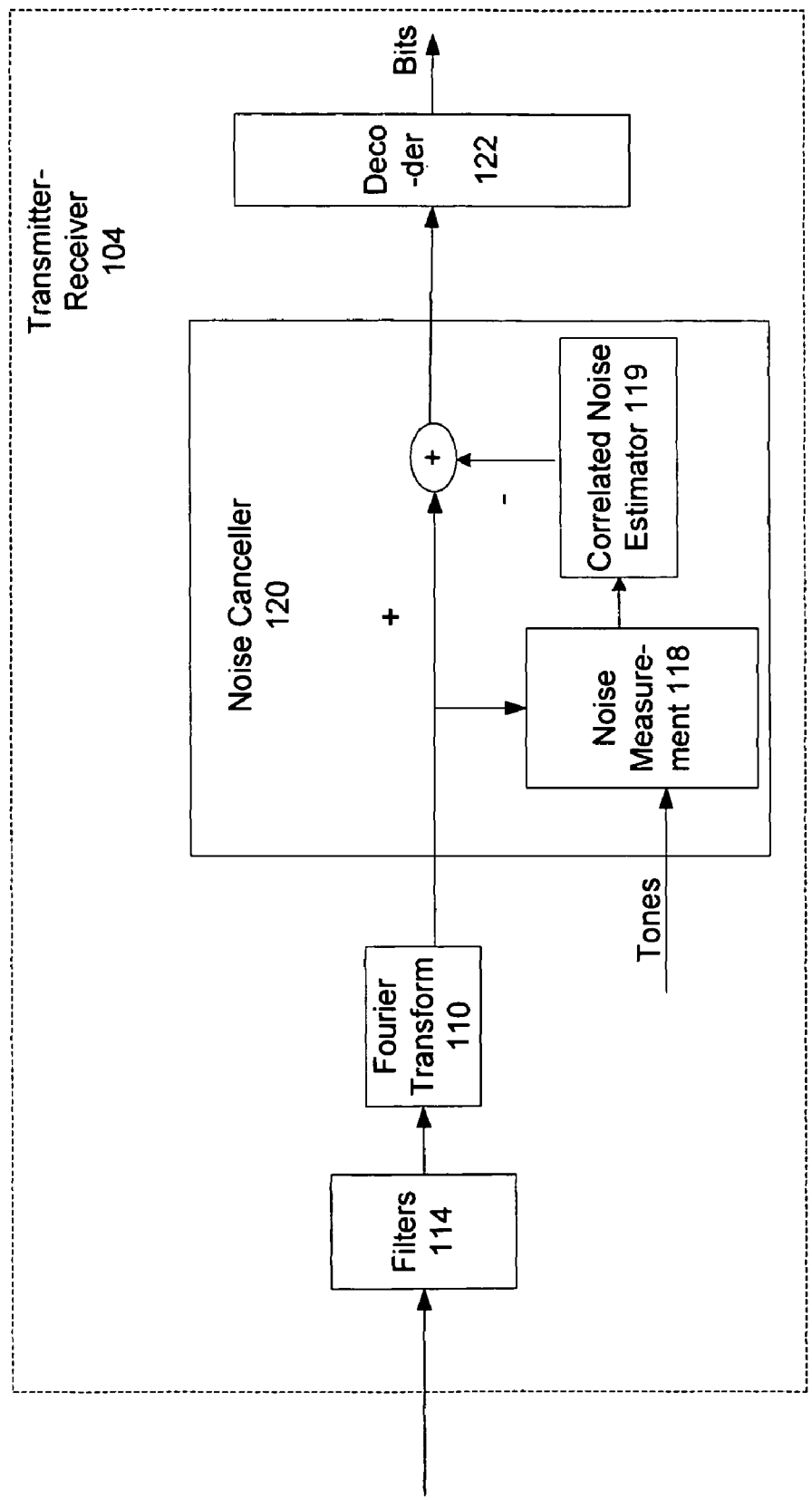
FIG. 5 illustrates an embodiment of a noise canceller in the discrete multiple tone system in accordance with the invention.

FIG. 5 illustrates an embodiment of Noise Canceller 120 as embodied in a transmitter-receiver that cancels estimated correlated noise present on a tone in the DMT system. In one embodiment, Noise Canceller 120 may include a Noise Detector 118 to measure the noise on one or more reference tones. Noise Detector 118 may contain software and/or logic programmed to detect for the presence of noise present on the reference tone. In one embodiment, the Noise Detector 118 detects the noise present on the reference tone during the training period. A training period occurs when initially establishing communications between the first transmitter-receiver device 102 and a second transmitter-receiver device 104. The training protocol may dictate the transmission of long strings of transmitted data points to assist in determining the noise present on the reference tone.

In one embodiment of a DMT system using QAM modulation, the Noise Detector 118 may detect an error difference between the actual amplitude of each transmitted data point in the QAM constellation and the expected amplitude for each data point in the QAM constellation. Noise Detector 118 may detect for the presence of noise based on the error difference detected between the received data point and expected data point. The error difference for each transmitted data point may be known as a noise sample.

In one embodiment, the Noise Detector 118 detects noise while the DMT system is operating during its data transmit and receive period, sometimes referred to as show-time. The Noise Detector 118 may detect noise on a reference tone, which may be silent, idle or loaded with data. When a reference tone is silent, the DMT system is not transmitting any signal on that tone. Accordingly, all signal measured by the Noise Detector 118 on the tone is noise. When a reference tone is loaded with data, the amount of noise present on a selected signal loaded with data may be determined by subtracting the actual received signal from the detected constellation reference point for that sub carrier corresponding to a particular data carried on the tone. Thus, the data may first be decoded to extract the noise sample. Accordingly, the Noise Detector block 118 may also include a decoder to decode the FFT output of the data on a loaded reference tone.

Noise Canceller 120 may also include a Tone Selection module, which selects tones to act as reference and target tones. In one embodiment, the tones are selected and then hard wired into the Noise Canceller 120. Alternatively, the Tone Selection module may select the tones dynamically. Alternatively, some tones may be selected and hard wired and other tones may be selected dynamically.

Selection of tones to perform as reference tones and target tones may be based on several factors. In one embodiment, the Tone Selection Module selects only those loaded reference tones that have high noise margin are selected as reference tones. Such selection may reduce the probability that error in the noise measurement on the reference tones or decoding error gets propagated to other tones through operations in the Noise Canceller 120. In one embodiment, the Tone Selection module may select certain tones as reference tones to cancel noise in particular areas of the spectrum. Such factors as transition bands of filters 114 and presence of RFI interference on a tone may further influence choice of reference tones. For instance, the Tone Selection module may determine that tones 32-42 have a lot of correlated noise because they are close to the transition bands of the filters 114. Thus, Tone Selection module may select tones 32-39 as reference tones to estimate and cancel projected correlated component of noise on neighboring tones 40-42. Also, an RFI source at a particular tone can have a detrimental affect on the SNR of neighboring tones. Thus, the Tone Selection module may select the center tone with the RFI source as a reference tone to estimate and cancel correlated components of noise on neighboring tones.

In one embodiment, Noise Canceller 120 may include a Correlated Noise Estimator 119 to estimate the correlated noise from the reference tone on the target tone. The Correlated Noise Estimator 119 may be conducted using the noise measured on the reference tone by the Noise Detector 118. In one embodiment, the Correlated Noise Estimator 119 determines the estimated correlated noise on a target channel by weighting the noise measured on the reference tone. The weighting factor may be for instance, a factor representing the effect of noise on the reference channel on the noise on the target channel. When more than one reference tones are used, the weighted measurement of noise on each reference tone may be added to determine the total estimated correlated noise on the target channel.

In one embodiment, the Correlated Noise Estimator 119 performs the following operation to estimate correlated noise on the target tone:

$$s(t_0) = \Sigma a(t,t_0)e(t); \ t \neq t_0 \quad \text{(Equation 1)}.$$

The term $s(t_0)$ represents a prediction of the component of noise on target tone $t_0$ that is correlated to noise on other reference tones. The $a(t,t_0)$ term represents the weighting factor. In one embodiment, $a(t,t_0)$ is a factor that represents the contribution of noise from a tone t to the target tone $t_0$ and is known as the Correlated Noise Canceller (CNC) coefficient. The term e(t) is the measure of noise on a reference tone t. Thus, in accordance with Equation 1, the estimated correlated noise on target tone $t_0$ using a single reference tone $t_1$ may be determined using the following exemplary equation:

$$s(t_0)=a(t_1,t_0)e(t_1) \quad \text{(Equation 2).}$$

Similarly, the estimated correlated noise on target tone $t_0$ using reference tones $t_1$ and $t_2$ may be determined using the following exemplary equation:

$$s(t_0)=a(t_1,t_0)e(t_1)+a(t_2,t_0)e(t_2) \quad \text{(Equation 3).}$$

Noise Canceller 120 may further determine a residual signal at the target tone to determine the tone's SNR. In one embodiment, the Noise Canceller 120 determines a residual signal at the target tone by canceling the estimated correlated noise from the noise at the target tone. Accordingly, the Noise Canceller 120 may subtract the estimated correlated noise on the target tone from the noise on the target tone to determine a residual signal at the target tone.

In one embodiment, Noise Canceller 120 performs the following operation:

$$e_c(t_0)=e(t_0)-\Sigma a(t,t_0)e(t); \ t\neq t_0 \quad \text{(Equation 4).}$$

The term $e_c(t_0)$ represents the value of residual noise on the target tone $t_0$. The term $e(t_0)$ represents the value of noise on the target tone $t_0$. The term $\Sigma a(t,t_0)e(t)$ represents the value of the estimated correlated noise on the target tone $t_0$.

In another embodiment, to determine a residual signal at the target tone, Noise Canceller 120 may subtract the estimated correlated noise on the target tone from the FFT output of the signal on the target tone to determine a residual signal on the target tone. In one embodiment, Noise Canceller 120 may perform the following operation:

$$x_c(t_0)=x(t_0)-\Sigma a(t,t_0)e(t); \ t\neq t_0 \quad \text{(Equation 5).}$$

The term $x_c(t_0)$ represents the residual noise at tone $t_0$. The term $x(t_0)$ represents the FFT output at target tone $t_0$. The term $\Sigma a(t,t_0)e(t)$ represents the value of estimated correlated noise on the target tone $t_0$.

The residual noise on the target tone may be used to determine the SNR for the target tone. The bit-loading algorithm may determine the data bits that the target tone may carry using the SNR.

Figure 6A:
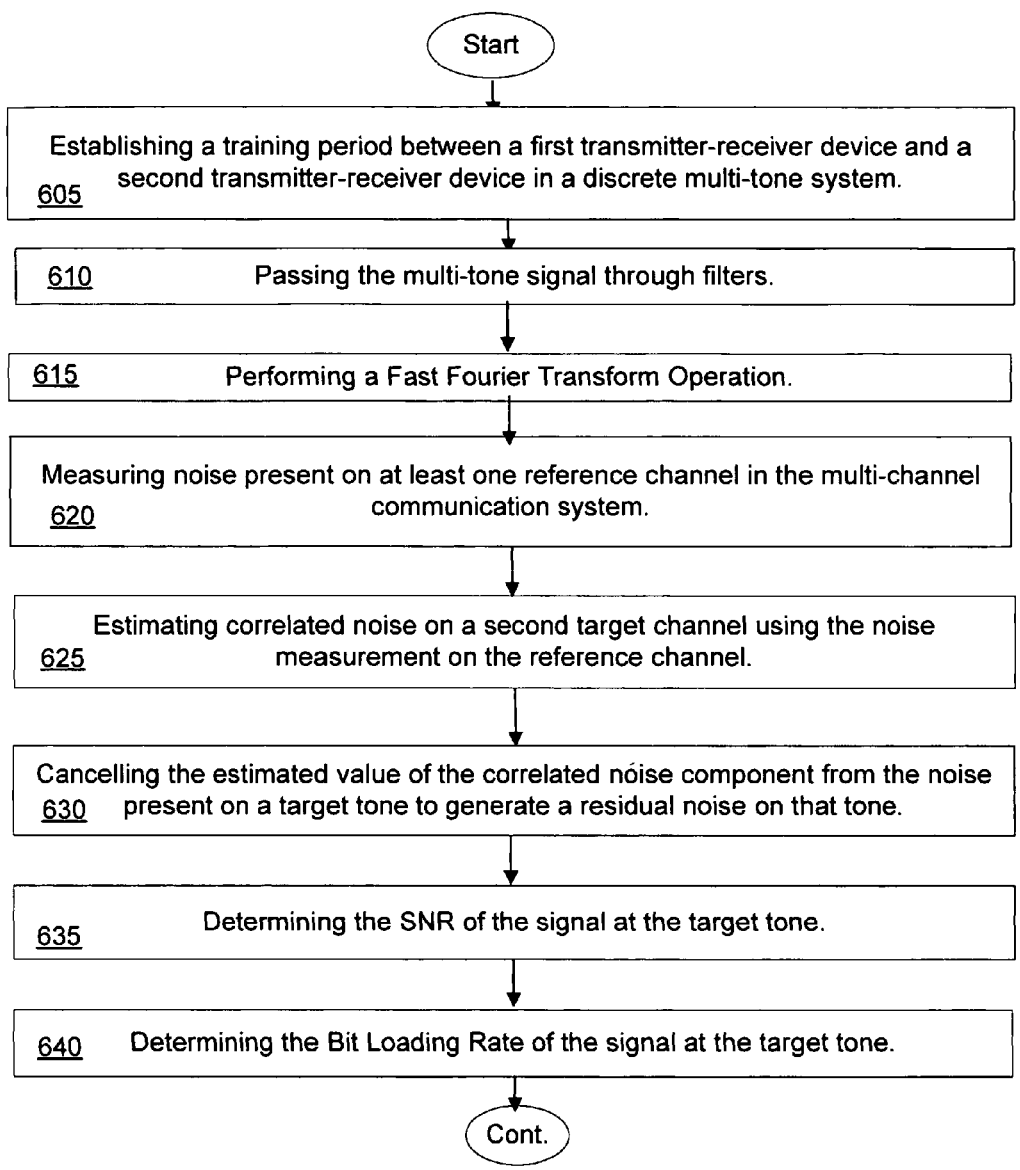
FIGS. 6a-6b illustrate flow charts of an embodiment for canceling the estimated correlated noise present in the discrete multiple tone system in accordance with the invention
Figure 6B:
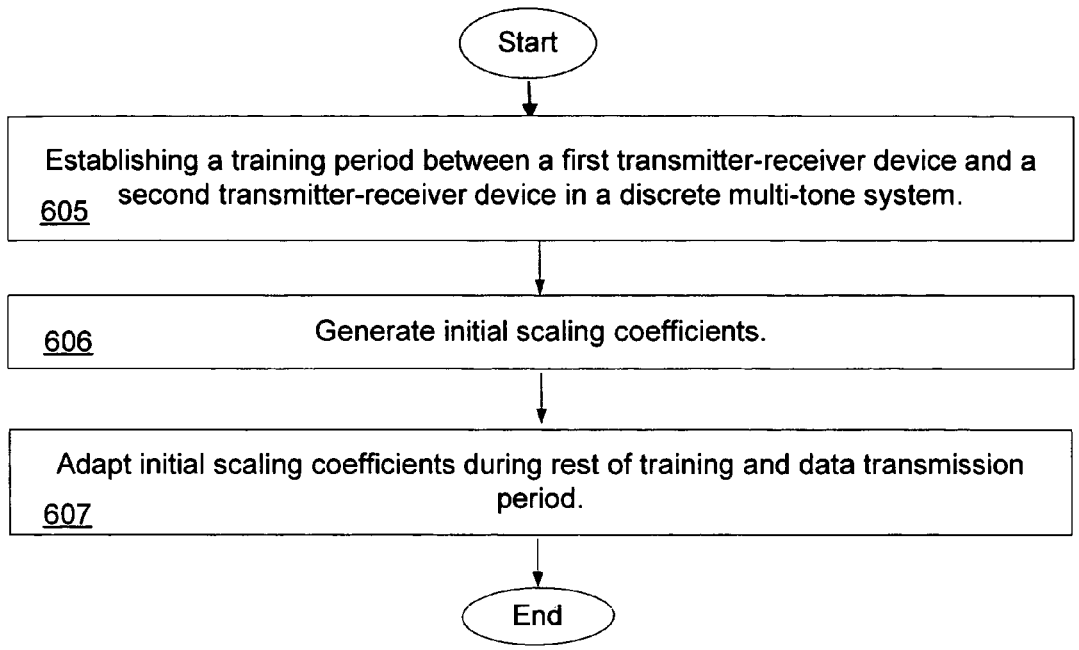

FIGS. 6a-6b illustrate a flow chart of an embodiment of a device that cancels estimated correlated noise in a multi-tone system. A device may perform the following operations for a particular target tone in the multiple tone system and then repeat these operations for other selected tones in the multiple tone system.

In block 605, a training period between a first transmitter-receiver device and a second transmitter-receiver device in the discrete multiple tone system may be established.

In block 610, a transmitter-receiver device may pass the multi-tone signal through a block of filters 114.

In block 615, the Fast-Fourier Transform block 110 receives the output of a block of filters 114. The Fast-Fourier Transform block 110 transforms the data samples of the multi-tone signal from the time-domain to the frequency domain. The FFT Block 110 acts as a demodulator to separate data corresponding to each tone in the multiple tone signal.

In block 620, a transmitter-receiver device may measure noise present on at least one reference tone in the multi-channel communication system.

In block 625, a transmitter-receiver device may estimate correlated noise on another tone selected as the target tone using the noise measurement on the reference tone. In one embodiment, the noise is estimated based on the following equation:

$$s(t_0)=\Sigma a(t,t_0)e(t); \ t\neq t_0 \quad \text{(Equation 1).}$$

The term $s(t_0)$ represents the estimated correlated noise on target tone $t_0$. The $a(t,t_0)$ term represents the weighting factor, which in one embodiment is a CNC coefficient. The CNC coefficient is a constant factor that represents the contribution of a tone t to the target tone $t_0$. The term $e(t)$ is the measure of noise on a tone t.

In block 630, the transmitter-receiver may subtract the estimated value of the correlated noise component from the total noise present on a target tone to generate a residual noise present on that tone.

In block 635, the transmitter-receiver may determine a signal to noise ratio for the target tone based on the residual noise present on that tone.

In block 640, the transmitter-receiver may determine bit loading rate for the target tone based on the determined signal to noise ratio for that tone.

FIG. 6b illustrates a flowchart for determining an initial value for coefficients to scale the correlated noise effect on other tones during the training period. In block 605, the transmitter-receiver may establish a training period between a first transmitter-receiver device and a second transmitter-receiver device in a discrete multi-tone system.

In block 606, the initial coefficients may be generated. In one embodiment, the training protocol may dictate the transmission of long strings of transmitted data points to assist in determining the noise present in the DMT system. The initial contribution of noise from a tone $t_1$ to the target tone $t_0$ is measured and may serve as the initial weighting factor.

In block 607, the values of the coefficients may be refined on a regular basis to scale the correlated noise effect during the rest of the training period and during the system data transmit and receiving period or show-time. In one embodiment, the sophistication may be achieved through the use of various algorithms, including many algorithms based on the minimum mean-square error (MMSE) algorithm. However, it may be desirable to use an adaptive algorithm to capture variations in the communication tone. In one embodiment, a Least Mean Square (LMS) algorithm is utilized.

LMS is an adaptive algorithm in which each measurement is used to improve the value of the scaling coefficients. The following equation illustrates updating the scaling coefficients after the nth measurement:

$$a_{n+1}(t,t_0)=a_n(t,t_0)+\mu \times e_{c,n}(t_0) \times e_n^*(t) \quad \text{(Equation 6).}$$

$\mu$ is the adaptation rate which depends on the power of error and determines the learning curve of the adaptive algorithm and also how much measurement noise affects the calculated value of coefficients; $e_n^*(t)$ is the conjugate complex of the $n^{th}$ error measurement and $e_{c,n}(t_0)$ is the error at tone $t_0$ and is obtained through equation 1. In one embodiment, a designer may choose how often the scaling coefficients are adapted during training and the data transit and receive period, depending on such factors as the capacity of the system to calculate the scaling coefficients.

Since ISI, echo, RFI and impulse noise are significant contributors to correlated noise among tones, the adaptive correlated noise canceller is an advantageous method for canceling ISI, echo, RFI and impulse noise adaptively.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

For example, a machine-readable medium may be provided having one or more instructions stored thereon, which instructions may be used to program a computer system or other electronic device to perform the operations described. A machine-readable medium may include any mechanism for storing or transmitting information in a form (e.g., software or processing application) readable by a machine (e.g., a computer). The machine-readable medium may include, but is not limited to, magnetic storage media (e.g., a floppy diskette), optical storage media (e.g., CD-ROM, CD-RW, DVD, etc.), magneto-optical storage media, read only memory (ROM), random access memory (RAM), erasable programmable memory (e.g., EPROM and EEPROM), flash memory, or other types of media suitable for storing electronic instructions.

The instructions and operations also may be practiced in distributed computing environments where the machine-readable media is stored on and/or executed by more than one computer system. In addition, the information transferred between computer systems may either be pulled or pushed across the communication media connecting the computer systems.

In general, although exemplary frequencies and tones are used in the description above, other frequencies, tones, and combinations thereof may be applicable to or affected by certain-embodiments of the present invention.

Furthermore, referring to FIG. 4, although the communication system 100 is described above in the context of an ADSL system, the communication system 100 is representative of alternative types of communication systems, such as wireless radio frequency (RF), that may employ multi-carrier communication schemes to communicate data from a transmitter to a receiver. Although the discrete multiple tone system 100 is described as utilizing QAM for modulation, other schemes for modulation such as Multiple Phase Shift Keying (MPSK), Differential Phase Shift Keying (DPSK) and packet modulation may be employed.

Referring to FIGS. 6a-6b, although the correlated noise cancellation method 600 is shown in the form of a flow chart having separate blocks and arrows, the operations described in a single block do not necessarily constitute a process or function that is dependent on or independent of the other operations described in other blocks. Furthermore, the order in which the operations are described herein is merely illustrative, and not limiting, as to the order in which such operations may occur in alternate embodiments. For example, some of the operations described may occur in series, in parallel, or in an alternating and/or iterative manner. Another approach is also possible.

While some specific embodiments of the invention have been shown the invention is not to be limited to these embodiments. The invention is to be understood as not limited by the specific embodiments described herein, but only by scope of the appended claims.

What is claimed is:

1. A method for estimating noise in a multi-channel communication system having a plurality of channels, comprising:
measuring noise present on a first and a second reference channel from among the plurality of channels;
estimating noise present on a target channel from among the plurality of channels that is correlated to the noise present on the first and the second reference channels by weighting the noise present on the first and the second reference channels using a first and a second weighting factor, respectively, and adding a first weighted noise measurement corresponding to weighted noise present on the first reference channel and a second weighted noise measurement corresponding to weighted noise present on the second reference channel; and
canceling the noise present on the target channel that is correlated to the noise present on the first and the second reference channels from the noise present on the target channel to determine a residual noise.

2. The method of claim 1, further comprising:
determining a signal to noise ratio (SNR) for the target channel based on the residual noise; and
determining a bit loading rate for the target channel based on the SNR.

3. The method of claim 1, wherein the first and the second weighting factors represent an effect of the noise present on the first and the second reference channels, respectively, on the noise present on the target channel.

4. The method of claim 3, wherein at least one of a group consisting of the first and the second weighting factors is initially determined during a training session of the multi-channel communication system and updated during data transmission periods of the multi-channel communication system.

5. The method of claim 3, wherein at least one of a group consisting of the first and the second weighting factors is refined using an adaptive algorithm.

6. The method of claim 5, wherein the adaptive algorithm is a Least Mean Square algorithm.

7. The method of claim 6, wherein the Least Mean Square algorithm further comprises:
updating at least one of the group consisting of the first and the second weighting factors after an $n^{th}$ measurement using by evaluating the equation:

$$a_{n+1}(t, t_0) = a_n(t, t_0) + \mu e_{c,n}(t_0) \times e_n^*(t),$$

where $\mu$ represents an adaptation rate, $e_n^*(t)$ represents a conjugate complex of an $n^{th}$ error measurement and $e_{c,n}(t_0)$ represents an error at $t_0$.

8. The method of claim 1, wherein canceling the noise present on the target channel that is correlated to the noise present on the first and the second reference channels from the noise present on the target channel further comprises:
subtracting noise present on the target channel that is correlated to the noise present on the first and the second reference channels from the noise present on the first and the second reference channels to determine the residual noise.

9. A method for estimating noise in a multi-channel communication system having a plurality of channels, comprising:
measuring noise present on a reference channel from among the plurality of channels;
estimating noise present on a target channel from among the plurality of channels that is correlated to the noise present on the reference channel by evaluating:

$$s(t_0) = \sum_{t \neq t_0} a(t, t_0) e(t),$$

where s($t_0$) represents the noise present on the target channel that is correlated to the noise present on the reference channel, a(t,$t_0$) represents the weighting factor, and e(t) represents the noise present on the reference channel; and canceling the noise present on the target channel that is correlated to the noise present on the reference channel from the noise present on the target channel to determine a residual noise.

10. A method for estimating noise in a multi-channel communication system having a plurality of channels, comprising:

measuring noise present on a reference channel from among the plurality of channels;

estimating noise present on a target channel from among the plurality of channels that is correlated to the noise present on the reference channel by determining a product of a weighting factor corresponding to the reference channel and the noise present on the reference channel; and canceling the noise present on the target channel that is correlated to the noise present on the reference channel from the noise present on the target channel to determine a residual noise by evaluating:

$$e_c(t_0) = e(t_0) - \sum a(t, t_0)e(t), t \neq t_0,$$

where $e_c(t_0)$ represents the residual noise on the target channel, e($t_0$) represents noise present on the target channel, and $\Sigma a(t,t_0)e(t)$ represents the noise present on the target channel that is correlated to the noise present on the reference channel.

11. A method for estimating noise in a multi-channel communication system having a plurality of channels, comprising:

measuring noise present on a reference channel from among the plurality of channels;

estimating noise present on a target channel from among the plurality of channels that is correlated to the noise present on the reference channel by determining a product of a weighting factor corresponding to the reference channel and the noise present on the reference channel; and canceling the noise present on the target channel that is correlated to the noise present on the reference channel from the noise present on the target channel to determine a residual noise by evaluating:

$$x_c(t_0) = x(t_0) - \sum a(t, t_0)e(t), t \neq t_0,$$

where $x_c(t_0)$ represents a Fast Fourier Transform value of the residual noise on the target channel, x($t_0$) represents a Fast Fourier Transform value of noise present on the target channel, and $\Sigma a(t,t_0)e(t)$ represents noise on the target channel that is correlated to the noise present on the reference channel.

12. A non-transitory computer readable medium having instructions stored thereon that, if executed by a machine, cause the machine to perform operations comprising:

measuring noise present on a first and a second reference channel from among a plurality of channels in a multi-channel communication system;

estimating noise present on a target channel from among the plurality of channels that is correlated to the noise present on the first and the second reference channels by weighting the noise present on the first and the second reference channels using a first and a second weighting factor, respectively, and adding a first weighted noise measurement corresponding to weighted noise present on the first reference channel and a second weighted noise measurement corresponding to weighted noise present on the second reference channel; and canceling the noise present on the target channel that is correlated to the noise present on the first and the second reference channels from the noise present on the target channel to determine a residual noise.

13. The non-transitory computer readable medium of claim 12, wherein estimating the noise present on the target channel correlated to the noise present on the first and the second reference channels comprises:

calculating the first and the second weighted noise factors based upon noise present on the first and the second reference channels, respectively.

14. The non-transitory computer readable medium of claim 13, wherein the first and the second weighted noise factors are factors representing correlation of the noise present on the first and the second reference channels, respectively, to the noise present on the target channel.

15. The non-transitory computer readable medium of claim 12, wherein canceling the noise present on the target channel that is correlated to the noise present on the first and the second reference channels from the noise present on the target channel further comprises:

subtracting the noise present on the target channel that is correlated to the noise present on the first and the second reference channels from the noise present on the target channel.

16. A method of determining a signal to noise ratio for a channel in a multi-channel communication system, comprising:

selecting a first and a second channel from among a plurality of channels as a first and a second reference channel, respectively;

selecting a third channel from among the plurality of channels as a target channel;

measuring the noise present on the first and the second reference channels;

predicting the noise present on the target channel correlated to the noise present on the first and the second reference channels by weighting the noise present on the first and the second reference channels using a first and a second weighting factor, respectively, and adding a first weighted noise measurement corresponding to weighted noise present on the first reference channel and a second weighted noise measurement corresponding to weighted noise present on the second reference channel;

generating a residual noise on the target channel by canceling the noise present on the target channel that is correlated noise to the noise present on the first and the second reference channels; and determining a signal to noise ratio for the target channel based on the residual noise.

17. An apparatus for estimating noise in a multi-channel communication system having a plurality of channels, comprising:

means for measuring noise present on a first and a second reference channel from among the plurality of channels;

means for estimating noise present on a target channel from among the plurality of channels that is correlated to the noise present on the first and the second reference channels by weighting the noise present on the first and the second reference channels using a first and a second weighting factor, respectively, and adding a first weighted noise measurement corresponding to weighted noise present on the first reference channel and a second weighted noise measurement corresponding to weighted noise present on the second reference channel; and means for generating a residual noise on the target channel by canceling the noise present on the target channel that is correlated to the noise present on the first and the second reference channels.

18. The apparatus of claim 17, further comprising:

means for selecting a first and a second channel from among the plurality of channels as the first and the second reference channels, respectively; and means for selecting a third channel from among the plurality of channels as the target channel.

19. The apparatus of claim 17, further comprising:

means for measuring a contribution of the noise present on the first and the second reference channels to the target channel.

20. A transmitter-receiver, comprising:

a noise canceller, comprising:

a noise detector configured to measure noise present a first and a second reference channel in a multi-channel communication system; and a noise estimator configured to estimate noise present on a target channel in the multi-channel communication system that is correlated to the noise present on the first and the second reference channels by weighting the noise present on the first and the second reference channels using a first and a second weighting factor, respectively, and adding a first weighted noise measurement corresponding to weighted noise present on the first reference channel and a second weighted noise measurement corresponding to weighted noise present on the second reference channel, wherein the noise canceller is configured to determine a residual noise present on the target channel based on noise present in the target channel that is correlated to the noise present on the first and the second reference channels.

21. The transmitter-receiver of claim 20, wherein the transmitter-receiver is further configured to:

determine a signal to noise ratio (SNR) for the target channel based on the residual noise, and determine a bit loading rate for the target channel based on the SNR for the target channel.

22. The transmitter-receiver of claim 20, wherein the first and the second weighting factors represent an effect of the noise present on the first and the second reference channels, respectively, on the noise present on the target channel.

23. The transmitter-receiver of claim 22, wherein at least one of a group consisting of the first and the second weighting factors is refined using an adaptive algorithm.

24. The transmitter-receiver of claim 23, wherein the adaptive algorithm is a Least Mean Square algorithm.

25. The transmitter-receiver of claim 20, wherein the noise canceller is further configured to determine the residual noise by subtracting the noise present on a target channel that is correlated to the noise present on the first and the second reference channels from the noise present on the target channel.

* * * * *

UNITED STATES PATENT AND TRADEMARK OFFICE
CERTIFICATE OF CORRECTION

| | | |
|---|---|---|
| PATENT NO. | : 7,852,950 B2 | Page 1 of 1 |
| APPLICATION NO. | : 11/067434 | |
| DATED | : December 14, 2010 | |
| INVENTOR(S) | : Hossein Sedarat | |

It is certified that error appears in the above-identified patent and that said Letters Patent is hereby corrected as shown below:

Title Page, Item (57), Abstract Section, Line 5, "on at least on reference" should read --on at least one reference--.

Signed and Sealed this
Ninth Day of August, 2011

David J. Kappos
*Director of the United States Patent and Trademark Office*